United States Patent
Vitek et al.

(10) Patent No.: US 6,735,461 B2
(45) Date of Patent: May 11, 2004

(54) FOCUSED ULTRASOUND SYSTEM WITH MRI SYNCHRONIZATION

(75) Inventors: Shuki Vitek, Haifa (IL); Avner Ezion, Haifa (IL); David Freundlich, Haifa (IL)

(73) Assignee: Insightec-Txsonics LTD (IT)

( * ) Notice: Subject to any disclaimer, the term of this patent is extended or adjusted under 35 U.S.C. 154(b) by 219 days.

(21) Appl. No.: 09/884,206

(22) Filed: Jun. 19, 2001

(65) Prior Publication Data

US 2002/0193681 A1 Dec. 19, 2002

(51) Int. Cl.$^7$ ................................. A61B 5/055
(52) U.S. Cl. ........................... 600/411; 601/3
(58) Field of Search ................. 600/411, 427, 600/439, 413, 428; 601/2–4

(56) References Cited

U.S. PATENT DOCUMENTS

| | | | |
|---|---|---|---|
| 4,554,925 A | | 11/1985 | Young |
| 5,307,812 A | | 5/1994 | Hardy et al. |
| 5,323,779 A | * | 6/1994 | Hardy et al. ............... 600/411 |
| 5,938,600 A | | 8/1999 | Van Vaals et al. |
| 6,148,225 A | * | 11/2000 | Kestler et al. ............ 600/411 |
| 6,188,923 B1 | * | 2/2001 | Bechtold .................. 600/427 |
| 6,419,648 B1 | * | 7/2002 | Vitek et al. ................... 601/3 |
| 6,501,978 B2 | * | 12/2002 | Wagshul et al. .......... 600/411 |
| 6,506,171 B1 | * | 1/2003 | Vitek et al. ................... 601/2 |

FOREIGN PATENT DOCUMENTS

| | | |
|---|---|---|
| FR | 2 649 002 | 1/1991 |
| WO | WO 01/50156 A1 | 7/2001 |

OTHER PUBLICATIONS

Simon Shakespeare, et al; "A Method for foetal heart monitoring during magneti resonance imaging using Doppler ultrasound"; Physiological Measurement, Nov. 1999, IOP Publishing, UK, vol. 20, No. 4, pp. 363–368.

David Sebok, et al; "Interleaved Magnetic Resonance and Ultrasound by Electronic Synchronization"; Investigative Radiology, vol. 26, No. 4, 1991, pp. 353–357.

* cited by examiner

Primary Examiner—Dennis W. Ruhl
Assistant Examiner—Runa Shoh Qaderi
(74) Attorney, Agent, or Firm—Bingham McCutchen LLP

(57) ABSTRACT

Systems and methods for performing a focused ultrasound procedure monitored using magnetic resonance imaging (MRI) is provided. An MRI system uses a timing sequence for transmitting radio frequency (RF) signals and detecting magnetic resonance (MR) response signals from a patient's body in response to the RF pulse sequences. A piezoelectric transducer is driven with drive signals such that the transducer emits acoustic energy towards a target tissue region within the patient's body. Parameters of the drive signals are changed at times during the timing sequence that minimize interference with the MRI system detecting MR response signals, e.g., during transmission of RF signals by the MRI system.

25 Claims, 4 Drawing Sheets

FOCUSED ULTRASOUND SYSTEM WITH MRI SYNCHRONIZATION

FIELD OF THE INVENTION

The present invention relates generally to systems and methods for minimizing interference between a magnetic imaging ("MRI") system and other electrical or electronic systems used in conjunction with an MRI system, such as focused ultrasound and/or ultrasound imaging systems, and more particularly to systems and methods for synchronizing changes in operating parameters or other electrical activities, e.g., during focused ultrasound procedures, with the timing of magnetic resonance imaging cycles.

BACKGROUND

Focused ultrasound systems have been suggested for directing heat to a target tissue region within a patient, such as a cancerous or benign tumor, to necrose or otherwise treat the tissue region with thermal energy. For example, a piezoelectric transducer located outside the patient's body may be used to focus high intensity acoustic waves, such as ultrasonic waves (acoustic waves with a frequency greater than about twenty kilohertz (20 kHz), and more typically between fifty kiloHertz and five Megahertz (0.05–5 MHz)), at an internal tissue region of a patient to therapeutically treat the tissue region. The ultrasonic waves may be used to ablate a tumor, thereby obviating the need for invasive surgery.

During such procedures, it is often desirable to image the tissues being treated, for example, using magnetic resonance imaging ("MRI"). Generally, an MRI system includes a static field magnet, a gradient field amplifier, a radio frequency ("RF") transmitter, and an RF receiver. The magnet includes a region for receiving a patient therein, and provides a static, relatively homogeneous magnetic field over the patient. A gradient field amplifier generates magnetic field gradients that vary the static magnetic field. The RF transmitter transmits RF pulse sequences over the patient to cause the patient's tissues to emit MR response signals. Raw MR response signals may be sensed by the RF receiver and then passed to a computation unit that computes an MR image, which may then be displayed.

An MRI system may be used to plan a procedure, for example, before a surgical or minimally invasive procedure, such as a focused ultrasound ablation procedure. A patient may initially be scanned in an MRI system to locate a target tissue region and/or to plan a trajectory between an entry point and the tissue region in preparation for a procedure. Once the target tissue region has been identified, MRI may be used during the procedure, for example, to image the tissue region and/or to guide the trajectory of an external ultrasound beam to a target tissue region being treated. In addition, an MRI system may be used to monitor the temperature of the tissue region during the procedure, for example, to ensure that only the target tissue region is destroyed during an ablation procedure without damaging surrounding healthy tissue.

One of the potential problems encountered when using MRI to image a focused ultrasound procedure is interference between the MRI system and the focused ultrasound system. An MRI system may be sensitive to radio frequency ("RF") signals, particularly those within the bandwidth used by the MRI system (which, for 1.5 Tesla MRI systems, generally is centered about sixty three MegaHertz (63 MHz)). In particular, transient signals, such as those used to drive a focused ultrasound system, may generate wide band noise and/or may radiate harmonics within the sensitive range of the MRI system. This noise may interfere with the MRI system, particularly when the RF receiver is activated and detecting MR response signals.

Accordingly, systems and methods for improving the results of magnetic resonance imaging during focused ultrasound procedures would be useful.

SUMMARY OF THE INVENTION

The present invention is directed generally to systems that operate in synchronization with a magnetic resonance imaging ("MRI") system, for example, during therapeutic, imaging, diagnostic, and/or other ultrasound procedures. Operation of these systems may be synchronized with operation of the MRI system to minimize interference between the systems. Preferably, systems and methods are provided for performing focused ultrasound procedures being monitored using magnetic resonance imaging, and more particularly to systems and methods for synchronizing active operations, such as changes in sonication parameters, burst transmissions, channel sampling, and the like, during focused ultrasound procedures with the timing of magnetic resonance imaging cycles to minimize interference with sensitive segments of the MRI process.

In accordance with one aspect of the present invention, a system is provided that includes an ("MRI") system, and a focused ultrasound system. The MRI system generally includes a static field magnet for generating a substantially static, homogenous magnetic field, a gradient field amplifier for varying the magnetic field in a predetermined manner, and a radio frequency ("RF") transmitter/receiver. The RF transmitter/receiver may include an RF transmitter for generating RF signals, e.g., pulse sequences, and a separate receiver for detecting MR responses of tissue. Alternatively, the RF transmitter/receiver may be a single device configured to operate alternatively in transmit and receive modes. The MRI system may include an MRI controller for providing a timing sequence or otherwise controlling operation of the RF transmitter/receiver and/or other components of the MRI system.

The focused ultrasound system ("FUS") includes a piezoelectric transducer, drive circuitry coupled to the transducer, and an FUS controller coupled to the drive circuitry. The drive circuitry is configured for providing drive signals to the transducer, which may include one or more transducer elements, such that the transducer emits acoustic energy towards a target tissue region within the patient's body.

The FUS controller is configured for controlling the drive circuitry to change parameters of the drive signals or otherwise activate the focused ultrasound system at one or more times during the timing sequence that substantially minimize interference with the MRI system detecting MR response signals generated by the patient's body. For example, the FUS controller may determine the timing sequence of the MRI system and control the drive circuitry based upon the timing sequence of the MRI system. Preferably, the FUS controller controls the drive circuitry to change parameters of the drive signals, e.g., frequency, amplitude, and/or phase, and/or perform other transient operations only when the MRI system transmits RF signals. Thus, the FUS controller may maintain the parameters of the drive signals substantially constant when the MRI system is detecting MR response signals emitted by the patient's body.

In one embodiment, an interface is provided for sampling timing signals generated by the MRI system, the timing signals being used to instruct the RF transmitter/receiver to transmit RF signals or to detect MR response signals. Preferably, the interface includes a cable for connecting to a timing sequence sampling port of the MRI system to the FUS controller. The FUS controller may change parameters of the drive signals only at one or more times during the timing sequence that minimize interference with the MRI system detecting MR response signals, as described above.

In an alternative embodiment, an antenna or other sensor may be coupled to the controller for detecting the RF signals transmitted by the MRI system. The FUS controller may use data obtained by the antenna to determine when the MRI system is beginning or terminating transmission of RF signals and/or detecting MR response signals, and control the focused ultrasound system accordingly.

In a further alternative, the FUS controller may synchronize clocks driving the MRI system and the transducer to obtain a synchronization constant relating clock speeds of the clocks. A delay between when the MRI system is initially activated and when the MRI system begins transmitting RF signals may be determined, e.g., empirically. The FUS controller may then determine the timing sequence of the MRI system by adjusting a predetermined cycle period of the MRI system by the delay and by the synchronization constant.

In accordance with another aspect, a method is provided for performing a focused ultrasound procedure being monitored using magnetic resonance imaging. Radio frequency (RF) pulse sequences are transmitted over the patient's body, e.g., using an MRI system, such as that described above. A piezoelectric transducer may be driven with electrical drive signals such that the transducer emits acoustic energy towards a target tissue region within the patient's body. MR response signals generated by tissue within the patient's body in response to the RF pulse sequences may be detected, e.g., by a receiver of the MRI system. Any activities generating signals that may interfere with the MRI receiver, e.g., by the focused ultrasound system and/or other electrical or electronic devices, may be synchronized with the MRI system, such as changing parameters of the drive signals to the transducer, sampling channels, and the like. Preferably, these "noisy" activities are performed only during the transmit phase of the MRI cycle, thereby substantially minimizing interference with detecting the MR response signals during the receive phase of the MRI cycle.

Other objects and features of the present invention will become apparent from consideration of the following description taken in conjunction with the accompanying drawings.

BRIEF DESCRIPTION OF THE DRAWINGS

Preferred embodiments of the present invention are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
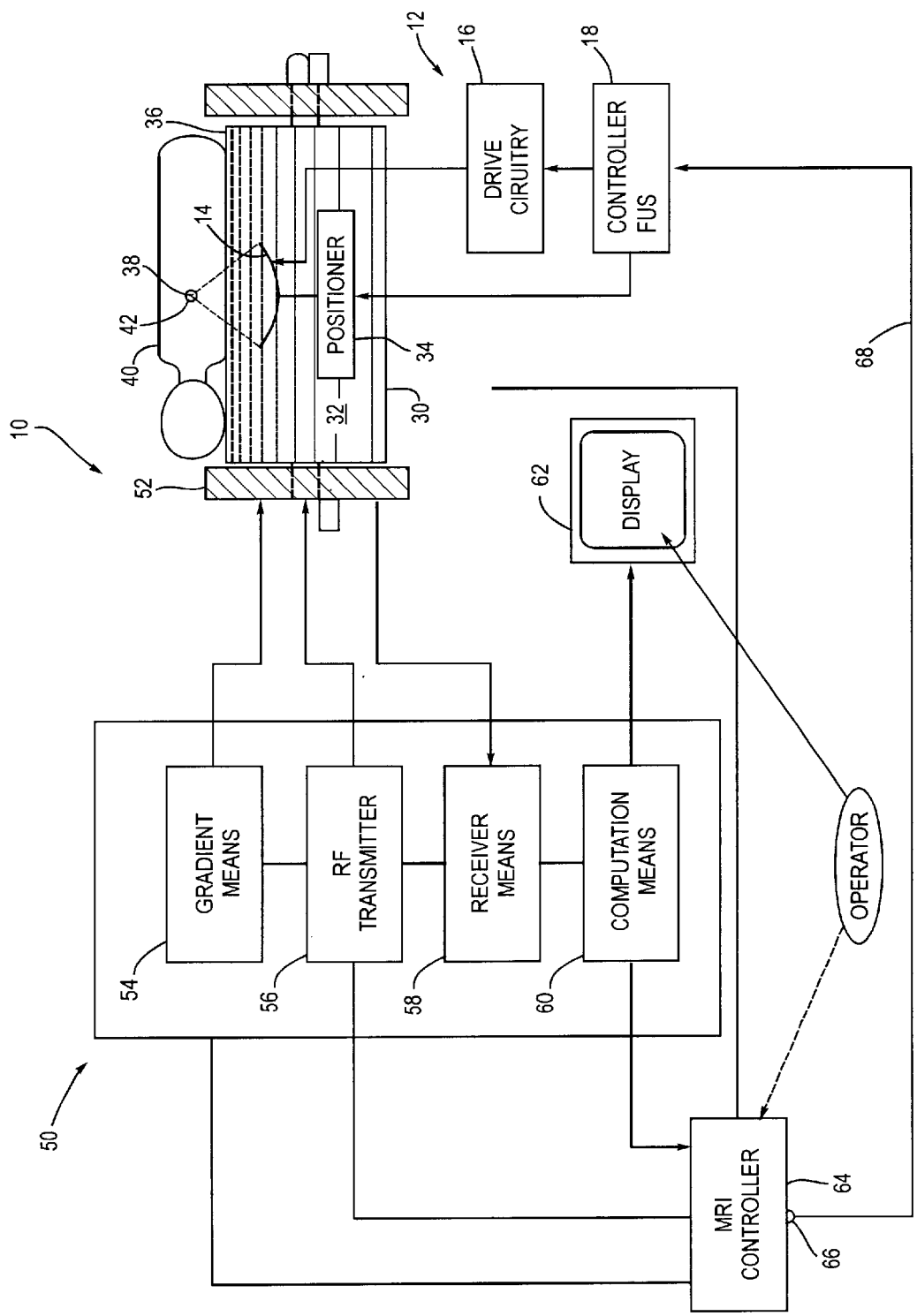
FIG. 1 is a schematic diagram of a system for performing MRI-guided focused ultrasound procedures, in accordance with the present invention.
Figure 2:
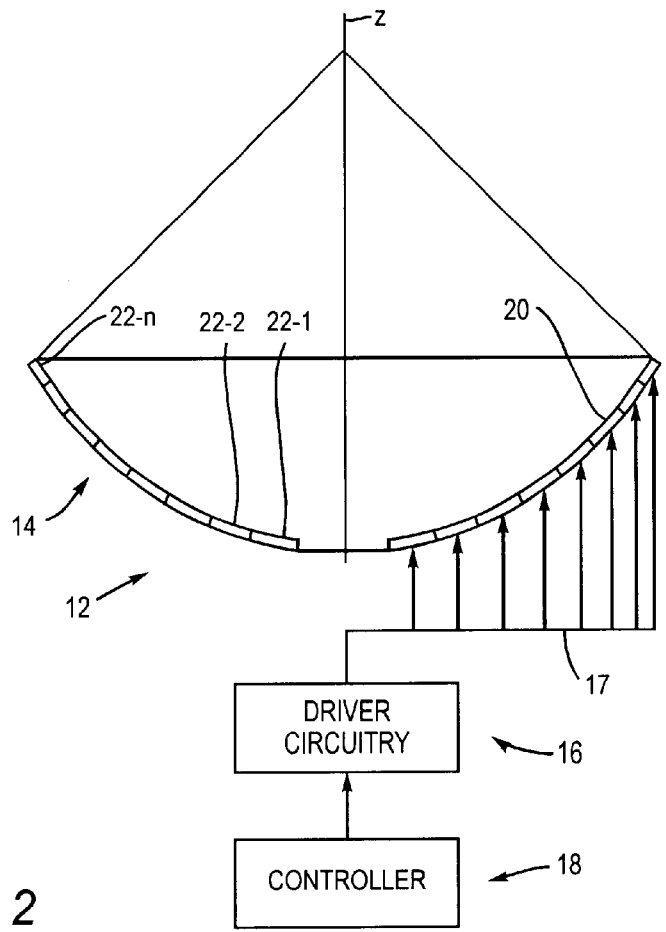
FIG. 2 is a schematic diagram of a focused ultrasound system, for use with the system of FIG. 1.
Figure 3:
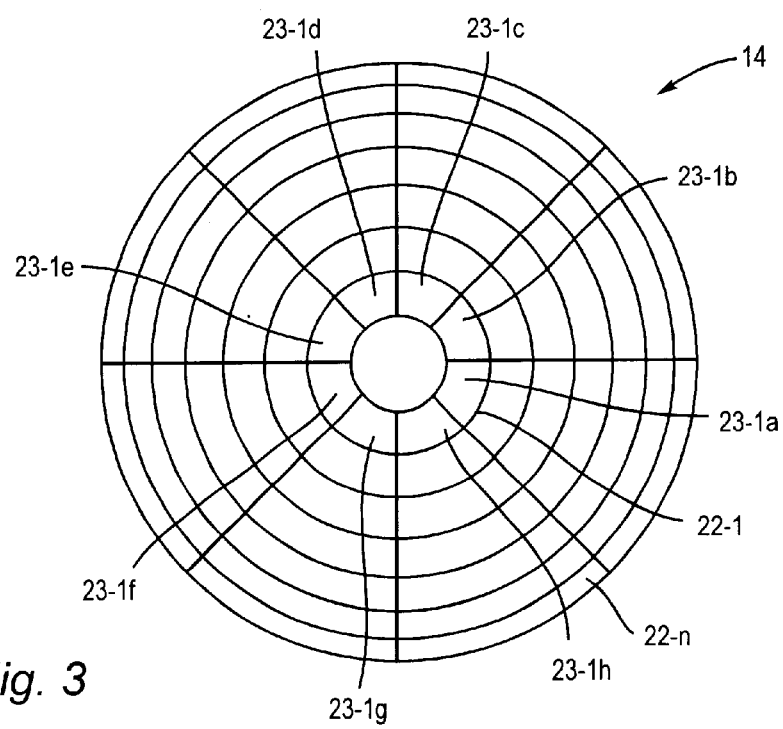
FIG. 3 is a top view of an exemplary embodiment of a transducer array, for use with the focused ultrasound system of FIG. 2.

Turning now to the drawings, FIGS. 1–3 show a preferred embodiment of an MRI-guided focused ultrasound system 10, in accordance with the present invention. The system 10 generally includes a focused ultrasound system 12 and a magnetic resonance imaging ("MRI") system 50. The focused ultrasound system 12 generally includes a piezoelectric transducer 14, drive circuitry 16, and a controller 18 (hereinafter referred to as the FUS controller).

With particular reference to FIGS. 2 and 3, the transducer 14 is preferably a transducer array formed from piezoelectric material constructed as is known to those skilled in the art. In a preferred embodiment, the transducer 14 may have a concave or bowl shape, such as a "spherical cap" shape, i.e., having a substantially constant radius of curvature such that the transducer 14 has an inside surface 20 defining a portion of a sphere. Alternatively, the transducer 14 may have a substantially flat configuration (not shown), and/or may include an outer perimeter that is generally, but not necessarily truly, circular (not shown).

FIG. 3 shows an exemplary embodiment of a transducer 14 that is divided radially into six (6) concentric rings and circumferentially into eight (8) sectors, thereby dividing the transducer 14 into forty eight (48) transducer elements 22. Alternatively, the transducer 14 may be divided into any desired number of rings and/or sectors (not shown). In a preferred embodiment, the transducer 14 has an outer diameter of between about eight and twelve centimeters (8–12 cm), a radius of curvature 16 between about eight and sixteen centimeters (8–16 cm), and includes between [_-_] rings and between four and sixteen (4–16) sectors.

In alternative embodiments, the transducer 14 may include one or more transducer elements having a variety of geometric shapes, such as hexagons, triangles, squares, and the like, and may be disposed about a central axis 28, preferably but not necessarily, in a substantially uniform or symmetrical configuration. The configuration of the transducer 14, however, is not important to the present invention, and any of a variety of known ultrasound transducers may be used, such as flat circular arrays, linear arrays, and the like. Additional information on the construction of a phased array transducer appropriate for use with the present invention may be found, for example, in C. Cain and S. Umemura, "Concentric-Ring and Sector-Vortex Phased-Array Applicators for Ultrasound Hyperthermia," IEEE Transactions on Microwave Theory and Techniques, vol. MTT-34, no. 5, pages 542–551 (May 1986); and T. Fjield and K. Hynynen, "The Combined Concentric-Ring and Sector-Vortex Phased Array for MRI Guided Ultrasound Surgery," IEEE Transactions on Ultrasonics, Ferroelectrics, and Frequency Control, vol. 44, no. 5, pages 1157–1167 (Sept. 1997), the disclosures of which are expressly incorporated herein by reference.

Returning to FIG. 1, the transducer 14 is mounted within a chamber 32 filled with degassed water or similar acoustically transmitting fluid. The chamber 32 may be located within a table 30 upon which a patient 40 may be disposed or within a fluid-filled bag mounted on a movable arm that may be placed against a patient's body (not shown). The transducer 14 is coupled to the drive circuitry 16, and/or the FUS controller 18 for generating and/or controlling the ultrasonic energy emitted by the transducer 14, as described further below.

A positioning system 34 may be connected to the transducer 14 for mechanically moving the transducer 14 in one or more directions, and preferably in any of three orthogonal directions. Alternatively, a focal distance (a distance from the transducer 14 to a focal zone 38 of the ultrasonic energy emitted by the transducer 14) may be adjusted electronically, e.g., using known methods, or using a combination of mechanical and electronic positioning. Exemplary transducers and positioning systems are disclosed in co-pending application Ser. Nos. 09/556,095, and 09/557,078, both filed Apr. 21, 2000. The disclosures of these references and any others cited therein are expressly incorporated herein by reference.

The top of the table 30 generally includes a flexible membrane 36 that is substantially transparent to ultrasound, such as mylar, polyvinyl chloride (PVC), or other suitable plastic material. A fluid-filled bag (not shown) may be provided on the membrane 36 that may conform easily to the contours of the patient 40 disposed on the table 30, thereby acoustically coupling the patient 40 to the transducer 14 within the chamber 32. In addition or alternatively, an acoustic gel, water, or other fluid (not shown) may be provided between the patient 40 and the membrane 36 to facilitate further acoustic coupling.

With particular reference to FIG. 2, each of the transducer elements 22 is individually coupled to the drive circuitry 16 in a conventional manner. The drive circuitry 16 is configured to provide electrical drive signals 17 to the transducer elements 22 at one or more frequencies, preferably at radio frequencies (RF), for example, between about 0.5–10 MHz, and more preferably between about 1.0 and 2.0 MHz. When electrical drive signals 17 are provided to the transducer elements 22, the transducer 14 emits ultrasonic energy from its inside surface 20, as is known to those skilled in the art.

The FUS controller 18 is coupled to the drive circuitry 16 for controlling several aspects of the drive signals 17 generated by the drive circuitry 16, such as amplitude, frequency, and/or phase. For example, the FUS controller 18 may control the amplitude of the drive signals 17 to control the intensity of ultrasonic energy delivered by the transducer 14, in a substantially conventional manner.

In addition, the FUS controller 18 may control a phase component of the drive signals 17 to respective transducer elements 22 to control a shape of a focal zone generated by the transducer 14 and/or to move the focal zone to a desired location. For example, the FUS controller 18 may control the phase shift of the drive signals based upon a radial position of respective transducer elements 22, e.g., to adjust a focal distance of the focal plane (i.e., the distance from the face of the transducer to the center of the focal zone). In addition or alternatively, the FUS controller 18 may control the positioning system 34 to move the transducer 14, and consequently the location of the focal zone 38 of the transducer 14, to a desired location, i.e., within the target tissue region 42.

Preferably, the FUS controller 18 is also configured for synchronizing and/or otherwise controlling the drive circuitry 16 and/or the transducer 14 to substantially minimize interference with the MRI system 50, as described further below.

Returning to FIG. 1, the MRI system 50 includes a static field magnet 52, a gradient field amplifier 54, a radio frequency ("RF") transmitter 56, an RF receiver 58, a control processor 64 (hereinafter referred to as the MRI controller), and a computation unit 60 that may acquire images of the patient 40, e.g., the tissue structure 42. The magnet 52 includes a region for receiving a patient 40 therein, and provides a static, relatively homogeneous magnetic field over the patient 40, as is well known in the art. The gradient field amplifier 54 generates magnetic field gradients that vary the static magnetic field in a known manner.

The RF transmitter 56 generates and transmits RF pulse sequences or other signals over the patient 40 to cause the tissue structure 42 to emit MR response signals, which may include free induction decay (FID) signals and/or echo signals. In a preferred embodiment, the RF transmitter 56 includes RF coils (not shown) in the magnet 52, and a pulse transmitter (also not shown), which may have a pulse transmitter frequency supplied by a synthesizer (not shown) and/or controlled by the MRI controller 64.

Raw MR response signals may be sensed by the receiver 58, which may include a separate set of RF coils (not shown) from the RF transmitter 50. Alternatively, an RF transmitter/receiver (not shown) may be provided that is configured to operate alternately in a transmit mode to transmit RF pulse sequences and in a receive mode to receive the MR response signals. For this alternative embodiment, the MRI controller 64 may control this operation, for example, by switching the RF coils of the RF transmitter 56 between the transmit and receive modes.

During operation, the MRI controller 64 may provide and/or otherwise control a timing sequence used to operate the MRI system 50. The MRI system 50 may be operated using a predetermined timing sequence, e.g., having a substantially constant period. The timing sequence may include one or more signals instructing the RF transmitter 56 to transmit RF pulse sequences, and/or instructing the receiver 58 to listen for MR response sequences.

Figure 4A:
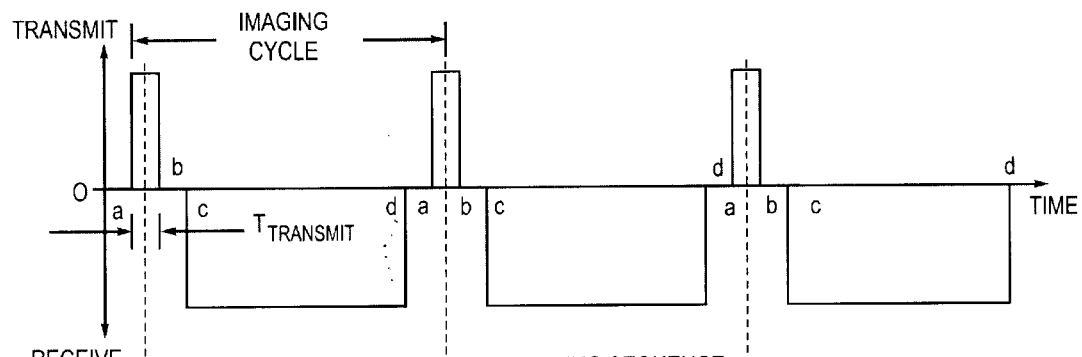
FIGS. 4A–4C are graphs, showing activities of a focused ultrasound system synchronized with a timing sequence of an MRI system, in accordance with the present invention.

Turning to FIG. 4A, the MRI controller 64 may generate an RF transmit/receive signal, e.g., a gated signal. This signal may be used to activate the RF transmitter 56 and/or the receiver 58, or alternatively separate signals may be provided to the transmitter 56 and/or receiver 58. The timing sequence may include imaging cycles having a period between about ten and fifty milliseconds (10–50 ms), and preferably about thirty milliseconds (30). During each cycle, the MRI controller 64 may initially provide a signal at point "a" to activate the RF transmitter 56 for a relatively short duration labeled $T_{TRANSMIT}$ in FIG. 4A, e.g., between about one to three milliseconds (1–3 ms), until discontinued at point "b." The RF transmitter 56 may transmit one or more pulse sequences during this portion of the cycle, or alternatively may be activated multiple times (not shown). After a predetermined delay or immediately upon termination of the transmit signal, the MRI controller 64 may provide a signal at point "c" to activate the receiver 58 until discontinued at point "d." The receiver 58 may remain active until the beginning of the next cycle, or alternatively, the receiver 58 may be activated at multiple times during the cycle, e.g., during portions of the cycle when the patient's body is expected to produce MR response signals.

The MR response signals may be passed from the receiver 58 to the computation unit 60, which may include an analog-to-digital converter and/or an image processor (both not shown), that computes an MR image. The computation unit 60 may then display the MR images on a display 62.

The MRI system 50 may use a variety of RF pulse sequences to generate MR images. In addition or alternatively, the MRI system 50 may employ real-time temperature-sensitive pulse sequences to rapidly acquire temperature-sensitive images of the patient 40. Optionally, temperature-sensitive images may be superimposed on other medical diagnostic images (such as conventional MR images) or provided on separate displays. Preferably, both the tissue structure 42 and regions heated by the focused ultrasound system 12 may be imaged simultaneously, thereby enabling an operator to accurately position the heated region, i.e., the focal zone 38, to correspond to the target tissue region 42. Additional information on systems and methods for obtaining temperature-sensitive MR images may be found in co-pending application Ser. No. 09/696,624, filed Oct. 20, 2000, the disclosure of which is expressly incorporated herein by reference.

Returning to FIG. 1, a system 10 in accordance with the present invention may synchronize activities of the focused ultrasound system 12 with the timing sequence of the MRI system 50 in order to substantially minimize the focused ultrasound system 12 interfering with the MRI system 50. An MRI system may be very sensitive to RF signals that are within its bandwidth, which is relatively narrow and may be centered, for example, around sixty three MegaHertz (63 MHz) for a 1.5 Tesla MRI system. Although the drive signals 17 used to drive the transducer 14 may be substantially lower than the signals of the MRI system 50, during transitional periods, e.g., when the drive signals 17 are being changed, noise may be generated, possibly including harmonics in the bandwidth of the MRI system 50.

To minimize interference, the FUS controller 18 may, for example, control the drive circuitry 16 in such a way that the drive circuitry 16 only changes parameters of the drive signals 17 during portions of the timing sequence that substantially minimize interference with sensitive portions of the MRI cycle. In addition or alternatively, the FUS controller 18 may only sample drive signals 17 or perform other activities during such insensitive portions of the MRI cycle.

Preferably, the FUS controller 18 controls the drive circuitry 16 to change parameters, e.g., amplitude, phase, and/or frequency, only when the RF transmitter 56 is transmitting RF pulse sequences. Because the RF pulse sequences have relatively high intensities as compared to the drive signals 17 used to drive the transducer 14, any noise generated by the drive signals 17 may be drowned out by the RF pulse sequences. Thus, even though changing frequencies and/or other parameters of the drive signals 17 may generate noise, possibly including harmonics in the bandwidth of the MRI system 50, the noise generated may not substantially affect the RF pulse sequences generated by the RF transmitter 56.

When the receiver 58 is activated, i.e., during the receive phase(s) of the MRI cycle, the parameters of the drive signals 17 may be maintained substantially constant, e.g., clean and stationary. Thus, noise generation by the focused ultrasound system 12 may be substantially reduced while the MRI system 50 detects MR response signals generated by the patient's body, thereby improving the accuracy and/or reliability of the MR images obtained.

Figure 4B:
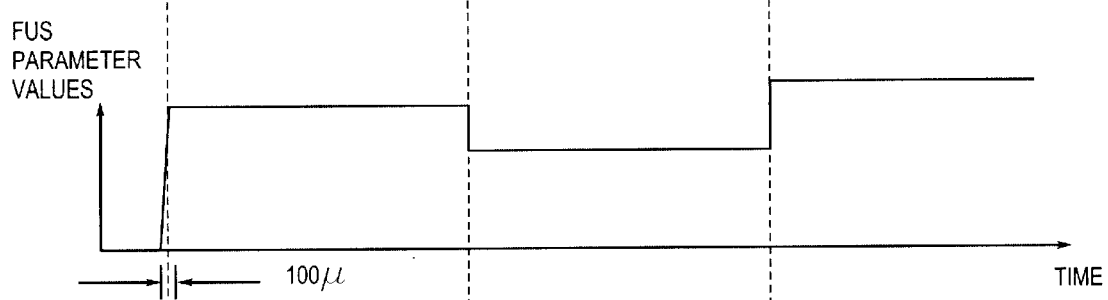
Figure 4C:
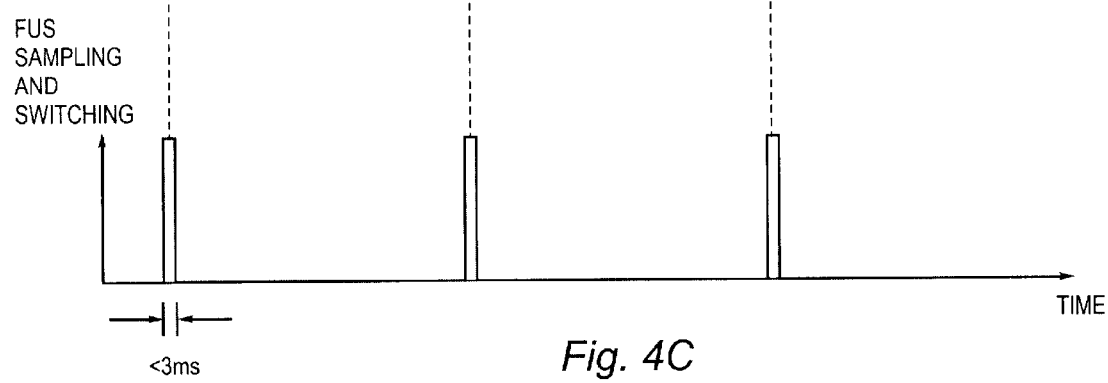

Turning to FIGS. 4B and 4C, exemplary activities of the focused ultrasound system 12 are shown that may be synchronized with the timing sequence of the MRI system 50, shown in FIG. 4A. For example, FIG. 4B shows an exemplary drive signal parameter (which may be an oscillation about a median, not shown), e.g., frequency, that may be changed only between points "a" and "b" of the MRI cycle, i.e., during $T_{TRANSMIT}$ when the RF transmitter 56 is activated and the receiver 58 is inactive. Generally, the time required to change parameters of a focused ultrasound system, i.e., to provide a new set of drive signals including respective frequencies, amplitudes, and/or phase shifts to a transducer 14, takes substantially less than three milliseconds (3 ms). For example, for a transducer 14 including about two hundred (200) transducer elements (not shown), new drive signals 17 may be provided to all two hundred (200) channels in not more than about one hundred microseconds (100 "$\mu$"s). Thus, by the time the receiver 58 is activated at point "c," the drive signals 17 may be substantially constant, thereby minimizing noise generation that may otherwise interfere with reception of MR response signals.

Similarly, as shown in FIG. 4C, the FUS controller 18 may sample drive signals provided by the drive circuitry 16 to the transducer 14, e.g., for diagnostic or other purposes. Such sampling may take less than about three milliseconds, and consequently may also be completed during the transmit portion of the MRI cycle.

In order to synchronize the focused ultrasound system 12 to the timing sequence of the MRI system 50, the FUS controller 18 may determine the timing sequence of the MRI system 50 in order to determine when it is best to change the drive signals 17 or perform other activities, e.g., only during the transmit mode of the MRI cycle and/or during quiet times of the receive mode.

Returning to FIG. 1, in a first embodiment, this may be achieved by connecting the FUS controller 18 to the MRI controller 64 in order to sample and/or switch timing signals provided by the MRI controller 64 to the RF transmitter 56 and/or the receiver 58. For example, the MRI system 50 may include an RF signal port 66 coupled to the MRI controller 64. The port 66 may be a conventional port used for calibration, diagnostic, and/or other purposes that involve acquiring RF transmit/receive signals being supplied to the RF transmitter 56 and/or receiver 58. Alternatively, a special port may be provided specifically for sampling by the FUS controller 18. A cable 68 or other connector may be provided for coupling the port 66 to the FUS controller 18. The FUS controller 18 may determine the timing sequence of the MRI system 50 from the sampled signals, and control the operation of the transducer 14 and/or other components of the focused ultrasound system 12 to minimize interference with the MRI system 50, as described above.

Although the FUS controller 18 and the MRI controller 64 have been described as being separate components, it will be appreciated by one skilled in the art that the operations performed by these controllers may be performed by one or more controllers, processors, and/or other electronic components, including software or hardware components, that may be provided as parts of the focused ultrasound system 12, the MRI system 50, and/or as a separate subsystem.

Figure 5:
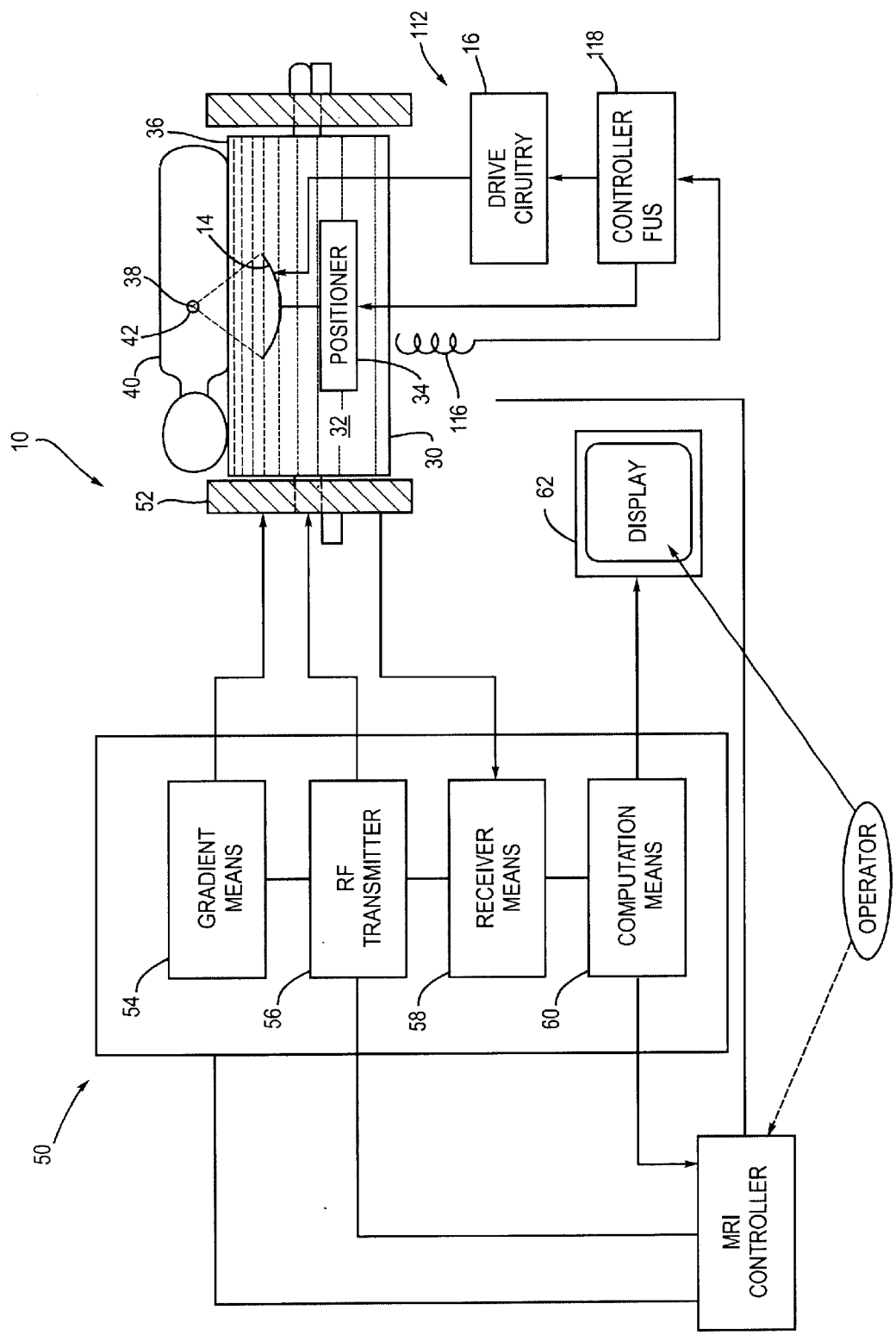
FIG. 5 is an alternative embodiment of a system for performing MRI-guided ultrasound procedures, in accordance with the present invention.

Turning to FIG. 5, an alternative embodiment of a system 110 is shown that includes a focused ultrasound system 112 and an MRI system 50 with components similar to the previous embodiment (with like components having like reference numbers). Unlike the previous embodiment, the focused ultrasound system 112 includes an antenna 166 or other sensor that may be coupled to the FUS controller 118. The antenna 166 may be provided in close proximity to the MRI system 150, e.g., within the table 30. The antenna 166 may detect when the RF transmitter 56 is transmitting RF pulse sequences, e.g., by detecting relatively high intensity RF signals. The FUS controller 118 may correlate the signals detected by the antenna 166 to determine when the RF pulse sequences begin and/or end, thereby determining when to control the drive circuitry 16 and/or other components of the focused ultrasound system 112 to minimize interference.

In a further alternative (not shown), a focused ultrasound system in accordance with the present invention may use an "open loop" procedure for determining the timing sequence of the MRI system. For example, with reference to FIG. 1, the FUS controller may synchronize a clock (not shown) driving the MRI system 50, e.g., within the MRI controller 64 with a clock (not shown) driving the drive circuitry 16 and/or the FUS controller 18. The FUS controller 18 may sample clock oscillations from the MRI controller 64 via port 66, and calculate a synchronization constant relating clock speeds of the clocks.

The FUS controller may determine a delay between when the MRI system 50 is initially activated and when the RF transmitter 56 begins transmitting RF pulse sequences, e.g., from empirical data provided to the FUS controller 18. Thus, the FUS controller 18 may also be used initially to activate the MRI system 50. The FUS controller 18 may then calculate the timing sequence of the MRI system 50 by adjusting a predetermined cycle period of the MRI system 50 by the delay and the synchronization constant. The calculated timing sequence may then be used to control the components of the focused ultrasound system 12 in order to minimize interference with the MRI system 50, as explained above.

It will be appreciated by those skilled in the art that the focused ultrasound systems described herein are merely exemplary of electrical or electronic systems that may be synchronized with an MRI system. For example, other therapeutic, imaging, and/or diagnostic systems and procedures, e.g., ultrasound imaging, may be used in conjunction with MRI. Further, an MRI system may be synchronized with therapeutic, imaging, and/or other systems to substantially minimize noise and/or other interference that the MRI system may cause sensitive components and/or phases of these systems.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the scope of the appended claims.

What is claimed is:

1. A method for performing a focused ultrasound procedure being monitored using a magnetic resonance imaging (MRI) system, the MRI system using a timing sequence for transmitting radio frequency (RF) pulse sequences and detecting magnetic resonance (MR) response signals from a patient's body in response to the RF pulse sequences, the method comprising:

driving a piezoelectric transducer with electrical drive signals such that the transducer emits acoustic energy towards a target tissue region within the patient's body while the MRI system is detecting MR response signals;

changing parameters of the drive signals only at one or more times during the timing sequence that minimize interference with the MRI system detecting MR response signals; and determining the timing sequence of the MRI system, wherein determining the timing sequence of the MRI system comprises synchronizing a clock driving the MRI system with a clock driving the transducer to obtain a synchronization constant relating clock speeds of the clocks;

determining a delay between when the MRI system is initially activated and when the MRI system begins transmitting RF pulse sequences; and determining the timing sequence of the MRI system by adjusting a predetermined cycle period of the MRI system by the delay and the synchronization constant.

2. The method of claim 1, wherein determining the timing sequence of the MRI system further comprises determining when the MRI system is transmitting RF pulse sequences, and wherein the changing parameters step comprises changing parameters of the drive signals only during times when the MRI system is transmitting RF pulse sequences.

3. The method of claim 1, wherein the changing parameters step comprises changing the parameters of the drive signals during a predetermined time interval after the MRI system transmits RF pulse sequences.

4. The method of claim 3, wherein the predetermined time interval corresponds to one or more time intervals between expected MR responses of tissue within the patient's body.

5. The method of claim 1, wherein the changing parameters step comprises sampling drive signals driving the transducer at one or more times during the timing sequence that minimize interference with the MRI system detecting MR response signals.

6. The method of claim 1, wherein determining the timing sequence of the MRI system further comprises sampling timing signals generated by the MRI system to instruct the MRI system to transmit RF pulse sequences or to detect MR response signals.

7. The method of claim 1, wherein determining the timing sequence of the MRI system further comprises sensing when RF transmissions by the MRI system begin or end.

8. The method of claim 1, wherein the changing parameters step comprises changing at least one of amplitude, frequency and phase shift of the drive signals.

9. A system for performing a focused ultrasound procedure being monitored using a magnetic resonance imaging (MRI) system, the MRI system using a timing sequence to control transmitting radio frequency (RF) signals and detecting magnetic resonance (MR) response signals from a patient's body in response to the RF signals, comprising:

a piezoelectric transducer;

drive circuitry coupled to the transducer, the drive circuitry configured for providing drive signals to the transducer such that the transducer emits acoustic energy towards a target tissue region within the patient's body;

a controller coupled to the drive circuitry for activating the transducer simultaneously with the MRI system, the controller configured for controlling the drive circuitry to change parameters of the drive signals at one or more times during the timing sequence that substantially minimize interference with the MRI system detecting MR response signals generated by the patient's body; and means coupled to the controller for determining the timing sequence of the MRI system, comprising means for synchronizing a clock driving the MRI system with a clock driving the transducer to obtain a synchronization constant relating clock speeds of the clocks; and means for determining a delay between when the MRI system is initially activated and when the MRI system begins transmitting RF signals;

wherein the controller is configured for determining the timing sequence of the MRI system by adjusting a predetermined cycle period of the MRI system by the delay and by the synchronization constant.

10. The system of claim 9, wherein the controller is configured for controlling the drive circuitry to change parameters based upon the timing sequence of the MRI system.

11. The system of claim 9, wherein the controller is configured for changing parameters of the drive signals only when the MRI system transmits RF signals.

12. The system of claim 9, wherein the means for determining the timing sequence of the MRI system further comprises an interface for sampling timing signals generated by the MRI system to instruct the MRI system to transmit RF signals or to detect MR response signals.

13. The system of claim 12, wherein the interface comprises a cable for connecting to a timing sequence sampling port of the MRI system.

14. The system of claim 9, wherein the means for determining the timing sequence of the MRI system further comprises means for determining when RF signals are being transmitted by the MRI system.

15. The system of claim 14, wherein the means for determining when RF signals are being transmitted by the MRI system comprises an antenna coupled to the controller for detecting the RF signals transmitted by the MRI system.

16. The system of claim 9, wherein the controller is configured for controlling at least one of amplitude, frequency and phase shift of the respective drive signals for focusing the acoustic energy at the target tissue region.

17. The system of claim 16, wherein the controller is configured for maintaining at least one of the amplitude, frequency, and phase shift of the respective drive signals substantially constant when the MRI system is detecting MR response signals emitted by the patient's body.

18. A method for performing a procedure being monitored using magnetic resonance imaging (MRI), the method comprising:

transmitting radio frequency (RF) pulse sequences over the patient's body;

operating a therapeutic or diagnostic device using electrical signals to perform a therapeutic or diagnostic procedure at a target tissue region within the patient's body;

detecting MR response signals generated by tissue within the patient's body in response to the RF pulse sequences while the therapeutic or diagnostic device is being operated;

maintaining the electrical signals substantially constant during the detecting step, thereby substantially minimizing interference with detecting MR response signals; and determining the timing sequence of the MRI system by
synchronizing a clock driving the MRI system with a clock controlling the electrical signals to obtain a synchronization constant relating clock speeds of the clocks;

determining a delay between when the MRI system is initially activated and when the MRI system begins transmitting RF pulse sequences; and determining the timing sequence of the MRI system by adjusting a predetermined cycle period of the MRI system by the delay and the synchronization constant.

19. The method of claim 18, wherein the therapeutic or diagnostic device comprises a piezoelectric transducer, wherein the operating step comprises driving the transducer with electrical drive signals to direct acoustic energy towards the target tissue region, and wherein the maintaining step comprises changing parameters of the drive signals only when the RF pulse sequences are being transmitted.

20. The method of claim 19, wherein the changing parameters step comprises changing parameters of the drive signals only at one or more times during the timing sequence that substantially minimize interference with detecting the MR response signals.

21. The method of claim 20, wherein the MRI system uses a timing sequence to control when the RF sequences are transmitted and when the MR response signals are detected, and wherein the changing parameters step comprises sampling drive signals driving the transducer at one or more times during the timing sequence that minimize interference with the MRI system detecting MR response signals.

22. The method of claim 20, wherein determining the timing sequence of the MRI system further comprises sampling timing signals generated by the MRI system.

23. The method of claim 20, wherein determining the timing sequence of the MRI system further comprises sensing when the transmitting RF pulse sequences step begins or ends.

24. The method of claim 19, wherein the changing parameters step comprises changing at least one of amplitude, frequency and phase shift of the drive signals.

25. The method of claim 18, wherein the step of transmitting RF pulse sequences is synchronized with the operating step to minimize interference of the MRI system with operation of the therapeutic or diagnostic device.

* * * * *

UNITED STATES PATENT AND TRADEMARK OFFICE
CERTIFICATE OF CORRECTION

PATENT NO.     : 6,735,461 B2
DATED          : May 11, 2004
INVENTOR(S)    : Shuki Vitek, Avner Ezion and David Freundlich It is certified that error appears in the above-identified patent and that said Letters Patent is hereby corrected as shown below:

Column 4,
Line 34, replace "between [ - ]" with -- multiple --

Signed and Sealed this

Third Day of May, 2005

JON W. DUDAS
*Director of the United States Patent and Trademark Office*